US012787181B2

(12) United States Patent
Zhao et al.

(10) Patent No.: US 12,787,181 B2
(45) Date of Patent: Nov. 3, 2026

(54) CIRCUIT BOARD AND DISPLAY DEVICE

(71) Applicant: BOE Technology Group Co., Ltd., Beijing (CN)

(72) Inventors: Kun Zhao, Beijing (CN); Zhongpeng Tian, Beijing (CN); Ce Ning, Beijing (CN); Zhengliang Li, Beijing (CN); Nianqi Yao, Beijing (CN); Jiayu He, Beijing (CN); Hehe Hu, Beijing (CN); Jie Huang, Beijing (CN); Feifei Li, Beijing (CN); Qi Qi, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 223 days.

(21) Appl. No.: 18/705,575

(22) PCT Filed: Apr. 27, 2023

(86) PCT No.: PCT/CN2023/091200
§ 371 (c)(1),
(2) Date: Apr. 28, 2024

(87) PCT Pub. No.: WO2023/216903
PCT Pub. Date: Nov. 16, 2023

(65) Prior Publication Data

US 2026/0129771 A1 May 7, 2026

(30) Foreign Application Priority Data

May 12, 2022 (CN) ......................... 202210516249.2

(51) Int. Cl.
*H05K 3/28* (2006.01)
*H05K 1/11* (2006.01)

(52) U.S. Cl.
CPC ............. *H05K 3/282* (2013.01); *H05K 1/111* (2013.01); *H05K 3/285* (2013.01); *H05K 2201/10106* (2013.01)

(58) Field of Classification Search
CPC .......... H05K 1/11; H05K 1/111; H05K 3/282; H05K 3/243; H05K 3/3452;
(Continued)

(56) References Cited

U.S. PATENT DOCUMENTS 4,532,174 A 7/1985 Freller et al.
2008/0202792 A1* 8/2008 Fogel .................. H10W 72/012 257/E23.021
(Continued)

FOREIGN PATENT DOCUMENTS

| | | | |
|---|---|---|---|
| CN | 113964112 | A | 1/2022 |
| CN | 116368631 | A | 6/2023 |
| JP | H1126672 | A | 1/1999 |

OTHER PUBLICATIONS

CN202210516249.2 First Office Action dated Jul. 20, 2026.

*Primary Examiner* — Tuan T Dinh
(74) *Attorney, Agent, or Firm* — IPro, PLLC

(57) ABSTRACT

A circuit board and a display device are disclosed. The circuit board includes: a base substrate including a device area; a plurality of first pads located on a side of the base substrate and in the device area, where a material of the first pads includes Cu; an oxidation protection layer located on a side away from the base substrate, of the first pads, where the plurality of first pads are bonded to a plurality of electronic components through the oxidation protection layer; a material of the oxidation protection layer includes CuaMgbXc, where X includes one or any combination of Al, Sn, Pb, Au, Ag, In, Zn, Bi, Ga, V, W, Y, Zr, Mo, Nb, Pt, Co or Sb.

20 Claims, 9 Drawing Sheets

(58) Field of Classification Search
CPC . H05K 2201/10106; H05K 2201/2081; H10D 30/6755; H10D 86/0221; H10D 86/0212; H10D 86/441; H10D 86/0231; H10D 86/423; H10D 86/431
USPC ................ 361/749–750, 782–784, 795, 803, 361/760–767
See application file for complete search history.

(56) References Cited

U.S. PATENT DOCUMENTS

| | | | | |
|---|---|---|---|---|
| 2009/0188706 | A1* | 7/2009 | Endo .................. | H01R 43/0256 216/13 |
| 2009/0191329 | A1* | 7/2009 | Wang ................... | H05K 3/3452 427/96.2 |
| 2011/0032467 | A1* | 2/2011 | Koike ....................... | C22C 9/05 349/139 |
| 2013/0032793 | A1* | 2/2013 | Kim ................... | H10D 30/6755 438/479 |
| 2014/0091306 | A1 | 4/2014 | Miki | |
| 2016/0373083 | A1* | 12/2016 | Lee ........................ | H03H 9/173 |
| 2017/0194502 | A1* | 7/2017 | Baeck ................ | H10D 30/6755 |
| 2019/0279922 | A1* | 9/2019 | Mauder ................ | H10D 62/129 |
| 2021/0091025 | A1 | 3/2021 | Pfahl et al. | |

* cited by examiner

CIRCUIT BOARD AND DISPLAY DEVICE

CROSS-REFERENCE TO RELATED APPLICATIONS

The present disclosure is a National Stage of International Application No. PCT/CN2023/091200, filed on Apr. 27, 2023, which claims priority to Chinese Patent Application No. 202210516249.2, filed with the China National Intellectual Property Administration on May 12, 2022, and entitled "Circuit Board and Display Device", the content of which is hereby incorporated by reference in its entirety.

TECHNICAL FIELD

The present disclosure relates to the field of display technology, and in particular to a circuit board and a display device.

BACKGROUND

SMT is a surface mounted technology (abbreviation for Surface Mounted Technology), which is the most popular technology and process in the electronic assembly industry. SMT is a technology of placing electronic components with pins on a base substrate with pads, and of soldering and assembling the electronic components on a surface of the base substrate through reflow soldering or dip soldering. In order to complete fixed connections between the electronic components and the pads, it is necessary to set solder on the pads to be electrically connected to the electronic components on the base substrate, or to set solder on pins of the electronic components, and then align the electronic components with the pads and make the electronic components with the pads be in contact. For example, at a high temperature of 230° C. to 260° C., the solder is melted and well moistened, and then quickly cooled down to achieve the fixed connections between the electronic components and the pads.

SUMMARY

Embodiments of the present disclosure provide a circuit board and a display device. The circuit board can avoid the problem of oxidation of the pads in the device area, ensuring reliable electrical connection between the electronic components and the circuit board, and improving product yield.

A circuit board according to an embodiment of the present disclosure includes:

a base substrate including a device area;

a plurality of first pads located on a side of the base substrate and in the device area, where a material of the first pads includes Cu;

an oxidation protection layer located on a side away from the base substrate, of the first pads, where the plurality of first pads are bonded to a plurality of electronic components through the oxidation protection layer; a material of the oxidation protection layer includes $Cu_aMg_bX_c$, where X includes one or any combination of Al, Sn, Pb, Au, Ag, In, Zn, Bi, Ga, V, W, Y, Zr, Mo, Nb, Pt, Co or Sb.

Optionally, in the circuit board according to an embodiment of the present disclosure, a thickness of the oxidation protection layer is in a range of 100 Å to 1000 Å.

Optionally, in the circuit board according to an embodiment of the present disclosure, in the material of the oxidation protection layer, a sum of a mass fraction of Mg and a mass fraction of X accounts for 5% to 90%.

Optionally, in the circuit board according to an embodiment of the present disclosure, a mass fraction of Cu accounts for 20% to 95%, the mass fraction of Mg accounts for 5% to 80%, and the mass fraction of X accounts for 10% to 40%.

Optionally, in the circuit board according to an embodiment of the present disclosure, an atomic ratio of Cu, Mg and X is 61:10:29.

Optionally, in the circuit board according to an embodiment of the present disclosure, the first pad includes: a first metal layer located between the base substrate and the oxidation protection layer, and a second metal layer between the first metal layer and the oxidation protection layer; where a material of the first metal layer is same as the material of the oxidation protection layer, and a material of the second metal layer includes Cu.

Optionally, in the circuit board according to an embodiment of the present disclosure, the base substrate further includes a bonding area, the bonding area includes a plurality of second pads located on the base substrate, the plurality of second pads are configured to be bonded to a printed circuit; the second pads and the first pads are located on a same film layer, and a side away from the base substrate, of the second pads includes the oxidation protection layer.

Optionally, the circuit board according to an embodiment of the present disclosure, the circuit board according to an embodiment of the present disclosure, further including a first wiring layer located between the first pads and the base substrate, where the first wiring layer includes a first sub-metal layer, a first sub-wiring layer and a second sub-metal layer which are stacked;

the first pads are electrically connected to the second sub-metal layer, and the second pads are electrically connected to the second sub-metal layer;

a material of the first sub-metal layer and a material of the second sub-metal layer include molybdenum-niobium alloy, and a material of the first sub-wiring layer includes copper.

Optionally, in the circuit board according to an embodiment of the present disclosure, the device area further includes: a first passivation layer located between the first wiring layer and the first pads, a first planarization layer between the first passivation layer and the first pads, a second planarization layer located on a side away from the base substrate, of the oxidation protection layer and covering an area between the plurality of first pads, and a first connection portion located on the oxidation protection layer.

Optionally, in the circuit board according to an embodiment of the present disclosure, the bonding area further includes: a second passivation layer located between the first wiring layer and the second pads, a third planarization layer between the second passivation layer and the second pads, a fourth planarization layer located on the side away from the base substrate, of the oxidation protection layer and covering an area between the plurality of second pads, and a second connection portion located on the oxidation protection layer;

the third planarization layer and the first planarization layer are arranged in a same layer, the fourth planarization layer and the second planarization layer are arranged in a same layer, and the second passivation layer and the first passivation layer are arranged in a same layer.

Optionally, in the circuit board according to an embodiment of the present disclosure, the plurality of first pads are divided into a plurality of groups of first pads, each of the groups of the first pads includes a cathode pad and an anode pad arranged in pairs;

the circuit board further includes a second wiring layer arranged in a same layer as the plurality of first pads, and a side away from the base substrate, of the second wiring layer includes the oxidation protection layer, and the second wiring layer is configured to realize a series connection or parallel connection of the plurality of groups of the first pads, and the second wiring layer is further configured to be electrically connected to the first wiring layer by a through hole penetrating the first planarization layer and the first passivation layer.

Optionally, the circuit board according to an embodiment of the present disclosure, further including a protection layer located on a side away from the base substrate, of the oxidation protection layer, the protection layer exposes the oxidation protection layer, a material of the protection layer includes silicon nitride or silicon oxide.

Correspondingly, an embodiment of the present disclosure further provides a display device, including: the circuit board according to any one of aforementioned embodiments, a printed circuit and a plurality of electronic components;

the plurality of electronic components are electrically connected to the plurality of first pads of the circuit board through the oxidation protection layer, and the printed circuit is electrically connected to a plurality of second pads of the circuit board through the oxidation protection layer.

Optionally, in the display device according to an embodiment of the present disclosure, each of the electronic components is a Mini LED or a Micro LED.

The beneficial effects of embodiments of the present disclosure are as follows.

Embodiments of the present disclosure provide a circuit board and a display device. After preparing the first pads using Cu material, an oxidation protective layer of $Cu_aMg_bX_c$ is prepared on the first pads, where X includes one or any combination of Al, Sn, Pb, Au, Ag, In, Zn, Bi, Ga, V, W, Y, Zr, Mo, Nb, Pt, Co, or Sb. On one hand, X can diffuse to a side away from the base substrate, of the oxidation protection layer, so that X is enriched on the side sway from the base substrate, of the oxidation protection layer. The X enriched on the surface is oxidized to form a passivation layer. On the other hand, a transition layer $Cu_aMg_bX_pO_g$ can be formed between $Cu_aMg_bX_c$ and the passivation layer, ensuring that the passivation layer $X_mO_n$ formed by X oxidation and the $Cu_aMg_bX_c$ alloy do not delaminate, that is, a complete transition between $Cu_aMg_bX_c$ and the oxidation protection layer is possible. The $Cu_aMg_bX_pO_g$ can further inhibit Cu in the first pad from being oxidized due to diffusing to the side away from the base substrate, of the oxidation protection layer. Therefore, the oxidation protection layer according to an embodiment of the present disclosure can prevent the first pads from being oxidized.

BRIEF DESCRIPTION OF FIGURES

In order to more clearly illustrate the technical solutions in embodiments of the present disclosure, a brief introduction will be given below to the drawings needed to be used in the description of embodiments. Obviously, the drawings in the following description are only some embodiments of the present disclosure. Those of ordinary skill in the art can also obtain other drawings based on these drawings without exerting creative efforts.

DETAILED DESCRIPTION

Figure 1:
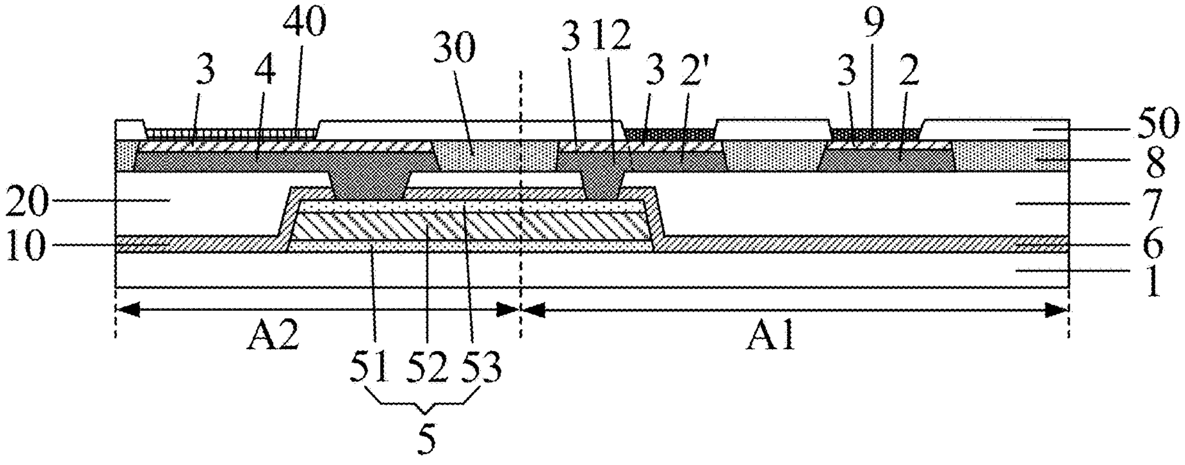
FIG. 1 is a schematic cross-sectional view along a direction AA' in FIG. 9.

In order to make the purpose, technical solutions and advantages of embodiments of the present disclosure more clear, the technical solutions of embodiments of the present disclosure will be clearly and completely described below in conjunction with the drawings of embodiments of the present disclosure. Obviously, the described embodiments are some, but not all, of embodiments of the present disclosure. Moreover, embodiments and features in embodiments of the present disclosure may be combined with each other without conflict. Based on the described embodiments of the present disclosure, all other embodiments obtained by those of ordinary skill in the art without creative efforts fall within the scope of protection of the present disclosure.

Unless otherwise defined, technical terms or scientific terms used in the present disclosure shall have the usual meaning understood by a person with ordinary skill in the art to which the present disclosure belongs. “First”, “second” and similar words used in the present disclosure do not indicate any order, quantity or importance, but are only used to distinguish different components. Words such as “include” or “comprise” mean that the elements or things appearing before the word include the elements or things listed after the word and their equivalents, without excluding other elements or things. Words such as "connect" or "connected" are not limited to physical or mechanical connections, but may include electrical connections, whether direct or indirect.

It should be noted that the sizes and shapes of the figures in the drawings do not reflect true proportions and are only intended to illustrate the present disclosure. Moreover, the same or similar reference numbers throughout represent the same or similar elements or elements with the same or similar functions.

Mini-LED (submillimeter light-emitting diode) refers to micro-light-emitting diodes with a size in a range of 80 μm to 300 μm. When the Mini-LED is used as the pixel point of the display panel to form a self-luminous display, a higher pixel density can be achieved compared to a small-pitch LED display. When the Mini-LED is used as a light source in a backlight module, an ultra-thin light source module can be produced through a denser light source arrangement; combined with local dimming technology, the display screen including the Mini-LED backlight module may have better contrast and high dynamic lighting rendering display effects. Micro LEDs with a size less than 80 μm can be directly used as pixels in near-eye, wearable, handheld terminals and other display panels.

The circuit board provided by the present disclosure may refer to a substrate used to provide a light source or a substrate used for display, which is not limited.

In related art, in order to complete the bonding of Mini/Micro LED to the circuit board, solder (such as solder paste) needs to be placed on the pads to be electrically connected to the Mini/Micro LED on the circuit board, and then the Mini/Micro LED is transferred to corresponding position on the circuit board, and then complete the fixation of the Mini/Micro LED and the circuit board through reflow soldering in a temperature range of 230° C. to 260° C. A printed circuit is bonded to the pads of the circuit board to be electrically connected to the printed circuit by hot pressing in a temperature range of 130° C. to 150° C.

Since bonding the Mini/Micro LED to the circuit board and bonding the printed circuit to the circuit board require different process conditions, the bonding the Mini/Micro LED to the circuit board and bonding the printed circuit to the circuit board cannot be achieved simultaneously. Therefore, for example, when Mini/Micro LED is bonded first, the pad material to be bonded with the printed circuit on the circuit board is easily oxidized under the process conditions corresponding to Mini/Micro LED bonding, which makes it hard to ensure that the printed circuit can achieve a good electrical connection with the circuit board, reducing product yield. It is understandable that the same problem may exist if the circuit board is bonded to the printed circuit first and then to the Mini/Micro LED.

Embodiments of the present disclosure provide a circuit board, which can be configured to display or provide backlight. As shown in FIG. 1, the circuit board includes:

a base substrate 1 including a device area A1;

a plurality of first pads (2 and 2') located on a side of the base substrate 1 and in the device area A1, where a material of the first pads (2 and 2') includes Cu;

an oxidation protection layer 3 located on a side away from the base substrate 1, of the first pads (2 and 2'), where the plurality of first pads (2 and 2') are configured to be bonded to a plurality of electronic components (not shown in FIG. 1) through the oxidation protection layer 3; a material of the oxidation protection layer 3 includes $Cu_aMg_bX_c$, where X includes one or any combination of Al, Sn, Pb, Au, Ag, In, Zn, Bi, Ga, V, W, Y, Zr, Mo, Nb, Pt, Co or Sb.

In the circuit board according to an embodiment of the present disclosure, after the first pads (2 and 2') are prepared using Cu material, an oxidation protection layer composed of $Cu_aMg_bX_c$ is prepared on the first pads (2 and 2'), where X includes one or any combination of Al, Sn, Pb, Au, Ag, In, Zn, Bi, Ga, V, W, Y, Zr, Mo, Nb, Pt, Co or Sb. On one hand, X can diffuse to a side away from the base substrate, of the oxidation protection layer, so that the surface away from the base substrate, of the oxidation protection layer is enriched with X. The X enriched on the surface is oxidized to form a passivation layer $X_mO_n$, which can inhibit the diffusion of oxygen from outside to the first pads, and inhibit the diffusion of Cu of the first pads to a side of the oxidation protection layer. On the other hand, a transition layer $Cu_aMg_bX_pO_g$ can be formed between $Cu_aMg_bX_c$ and the passivation layer $X_mO_n$, thus ensuring that the passivation layer $X_mO_n$ and the $Cu_aMg_bX_c$ alloy do not delaminate. $Cu_aMg_bX_pO_g$ can further inhibit Cu in the first pads from diffusing to the side away from the base substrate, of the oxidation protection layer to prevent the first pads from being oxidized. Therefore, the oxidation protection layer according to an embodiment of the present disclosure can prevent the first pads from being oxidized. In addition, by adding an anti-oxidation $Cu_aMg_bX_c$ alloy film layer on the first pads, embodiments of the present disclosure can achieve oxidation resistance without additional anti-oxidation process, greatly simplifying the process flow and reducing mass production cost. Moreover, in embodiments of the present disclosure, a $Cu_aMg_bX_c$ alloy film can be deposited by target sputtering. There is no need to use nickel-gold process or organic solderability preservatives (OSP) for anti-oxidation treatment after fabricating the pads in related art, which reduces the cost and improves production efficiency. Moreover, the $Cu_aMg_bX_c$ oxidation protection layer according to embodiments of the present disclosure has good oxidation resistance in high temperature environments, where a, b, c, m, n, p, q are all positive integers.

It should be noted that the circuit board according to an embodiment of the present disclosure may be a display substrate or a backlight substrate. If the circuit board is a display substrate, the device area constitutes the display area, and each of the electronic components is a sub-pixel, realizing a display screen. If the circuit board is a backlight substrate, the device area is configured to provide a light source to achieve display with a passive display panel.

The electronic components may include light-emitting components, micro-integrated circuits, capacitors, resistors, inductors and other components. The light-emitting component can be Mini LED or Micro LED, etc.

The present disclosure does not limit the luminous color of the device area included in the circuit board. The device area can be any of a red device area, a green device area, or a blue device area. The circuit board can simultaneously include device areas with three luminescent colors: red device area, green device area and blue device area. Of course, the circuit board can also include only one luminous color device area, for example, only include a plurality of red device areas, a plurality of green device areas, or a plurality of blue device areas, which can be determined according to actual requirements.

The present disclosure does not limit the control method of the device area. For example, each of the device areas can be controlled independently, or a plurality of device areas can be controlled simultaneously.

A material of the base substrate may be a rigid material, such as glass, quartz, plastic, or a printed circuit board, or it may be a flexible material, such as polyimide.

In specific implementation, in the above-mentioned circuit board according to an embodiment of the present disclosure, as shown in FIG. 1, the oxidation protection layer 3 mainly plays the role of protecting the first pads (2 and 2'), so the thickness of the oxidation protection layer 3 cannot be too thick to avoid increasing the difficulty of etching and thus failing to ensure the pattern morphology, and the thickness of the oxidation protection layer 3 cannot be too thin, otherwise the anti-oxidation performance may be poor. Therefore, two factors of process realization and anti-oxidation performance are comprehensively considered. The thickness of the oxidation protection layer 3 in embodiments of the present disclosure can take a value in a range of 100 Å to 1000 Å, for example, 100 Å, 200 Å, 300 Å, 400 Å, 500 Å, 600 Å, 700 Å, 800 Å, 900 Å, 1000 Å.

The oxidation protection layer in an embodiment of the present disclosure can be obtained by direct sputtering of an alloy target, or can be obtained by co-sputtering of single metal targets, which can be selected according to actual needs.

In specific implementation, in the above-mentioned circuit board according to an embodiment of the present disclosure, as shown in FIG. 1, in the material of the oxidation protection layer 3, a sum of a mass fraction of Mg and a mass fraction of X accounts for 5% to 90%. The inventor of the present disclosure found through testing that when a mass fraction of Cu accounts for 20% to 95%, the mass fraction of Mg accounts for 5% to 80%, and the mass fraction of X accounts for 10% to 40%, the oxidation protection layer 3 has relatively good antioxidant performance.

During specific implementation, in the above-mentioned circuit board according to an embodiment of the present disclosure, in the oxidation protection layer made of $Cu_a Mg_b X_c$, the inventor of the present disclosure found through testing that when an atomic ratio of Cu, Mg and X is 61:10:29, the oxidation protection layer 3 has good anti-oxidation performance and can ensure that oxidation does not occur in the subsequent white oil solidification process and reflow soldering process.

Figure 7:
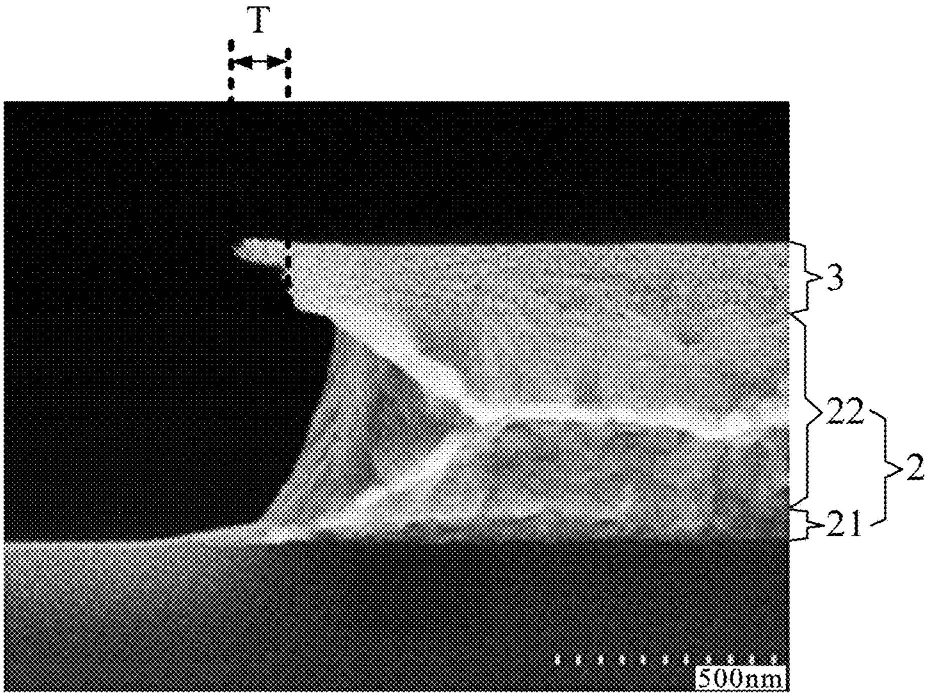
FIG. 7 is a scanning electron microscope photograph of the first pad/oxidation protection layer stack after etching according to an embodiment of the present disclosure.

In specific implementation, in the above circuit board according to an embodiment of the present disclosure, as shown in FIG. 1 and FIG. 7, the first pads (2 and 2') include: a first metal layer 21 located between the base substrate 1 and the oxidation protection layer 3, and a second metal layer 22 located between the first metal layer 21 and the oxidation protection layer 3. A material of the first metal layer 21 can be same as the material of the oxidation protection layer 3, and a material of the second metal layer 22 includes Cu. The material of first metal layer 21 is set to be the same as the material of oxidation protection layer 3, which can reduce the quantity of target materials used.

It should be noted that the material of the second metal layer 22 is generally pure Cu, but inevitably includes some impurities, so the Cu content in the material of the second metal layer 22 is greater than 99%.

During specific implementation, the material of the first metal layer 21 according to an embodiment of the present disclosure may also include molybdenum-niobium alloy.

During specific implementation, in the above-mentioned circuit board according to an embodiment of the present disclosure, as shown in FIG. 1, the base substrate 1 further include a bonding area A2. The bonding area A2 includes a plurality of second pads 4 located on the base substrate 1. The plurality of second pads 4 are configured to be bonded to a printed circuit (not shown in FIG. 1). The second pads 4 and the first pads (2 and 2') are located on a same film layer. A side away from the base substrate 1, of the second pads 4 includes the oxidation protection layer 3. The fact that the second pads 4 and the first pads (2 and 2') are located on the same film layer means that the second pads 4 and the first pads (2 and 2') are fabricated using one-time patterning process. The one-time patterning process refers to forming the required pattern through one-time film formation and photolithography process. The one-time patterning process includes film formation, exposure, development, etching and stripping. The second pads 4 and the first pads (2 and 2') are located on the same film layer, reducing the number of patterning processes, simplifying the manufacturing process, and significantly reducing production costs. At the same time, the side away from the base substrate 1, of the second pads 4 can also include the oxidation protection layer 3, so that the surface of the second pads 4 also has oxidation resistance, thus the second pads 4 in the bonding area A2 can be avoided the problem of oxidation in the process of fabricating the circuit board, and the stability of the second pads 4 is improved.

Figure 2A:
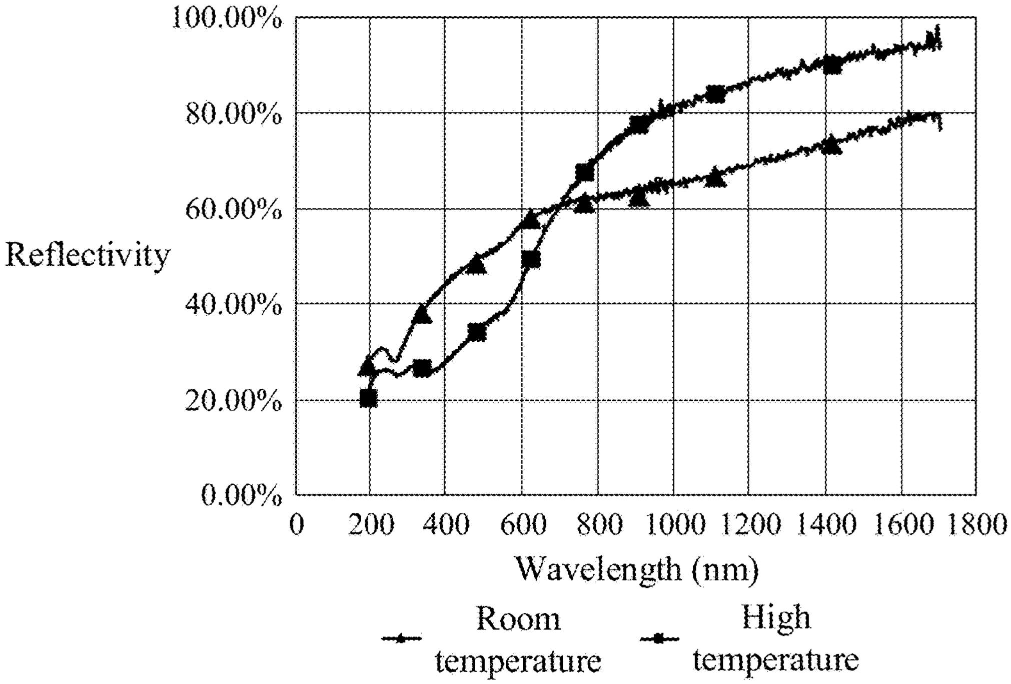
FIG. 2A is a schematic diagram of a reflectivity-wavelength change relationship of a CuNi alloy film after deposition and at a temperature of 150° C.
Figure 2B:
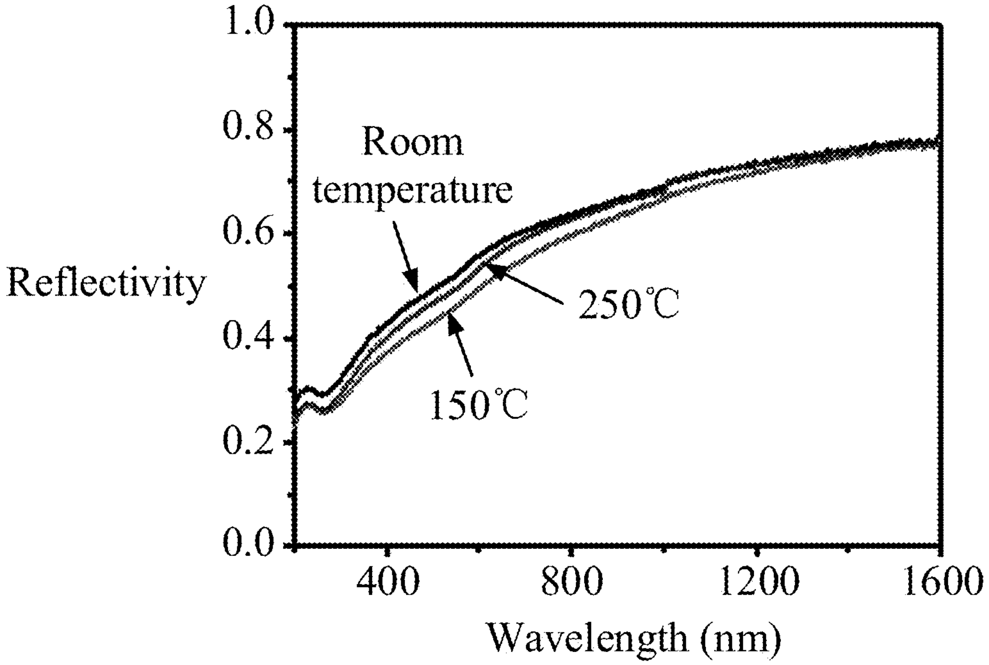
FIG. 2B is a schematic diagram of a reflectivity-wavelength change relationship of a oxidation protection layer made of CuMgAl under different conditions according to an embodiment of the present disclosure.
Figure 3A:
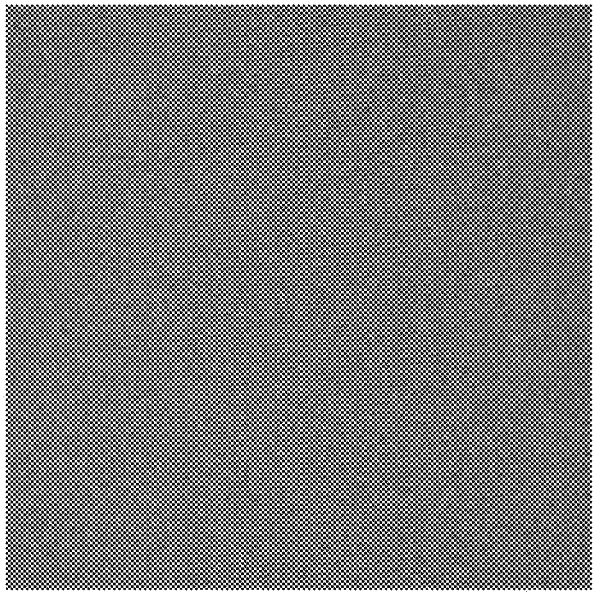
FIG. 3A shows surface oxidation of a CuNi alloy film in an air atmosphere at 150° C.
Figure 3B:
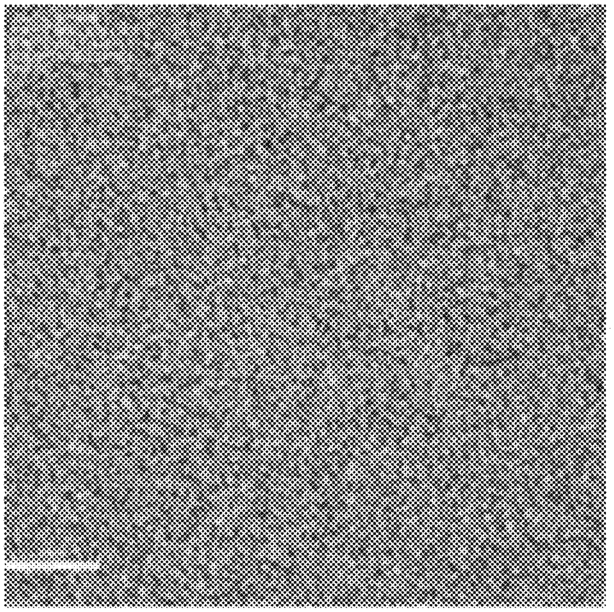
FIG. 3B shows surface oxidation of a CuNi alloy film in a $N_2$ atmosphere at 250° C.

When the metal film layer undergoes an oxidation reaction, its composition changes and the reflectivity decreases significantly. Related art discloses a solution of using CuNi alloy as the oxidation protection layer. In an embodiment of the present disclosure, the material of the oxidation protection layer is CuMgAl, and the oxidation condition of the metal surface is analyzed through reflectivity testing, as shown in FIG. 2A and FIG. 2B, FIG. 2A is a schematic diagram of a reflectivity-wavelength change relationship of a CuNi alloy film formed by a sputtering process at a room temperature (for example, 10° C.-50° C., such as 25° C., 30° C.) and the CuNi alloy film in an air atmosphere of 150° C. for 60 minutes (expressed at a high temperature). FIG. 2B is a schematic diagram of a reflectivity-wavelength change relationship of a oxidation protection layer made of CuMgAl alloy under different conditions according to embodiments of the present disclosure, which includes a reflectivity change curve of a CuMgAl alloy film formed by a sputtering process at a room temperature, a reflectivity change curve of a CuMgAl alloy film after deposition in air at 150° C. for 60 minutes, and a reflectivity change curve of a CuMgAl alloy film after deposition in nitrogen ($N_2$) at 250° C. for 30 minutes. It can be seen from FIG. 2A and FIG. 2B that the CuNi alloy film has an obvious reflectivity decrease at 150° C., indicating that the CuNi alloy is oxidized at 150° C. However, there is no significant change in reflectivity of the CuMgAl of embodiments of the present disclosure at 150° C. and 250° C., so the CuMgAl in embodiments of the present disclosure still has good oxidation resistance at 150° C. and 250° C.

Figure 4A:
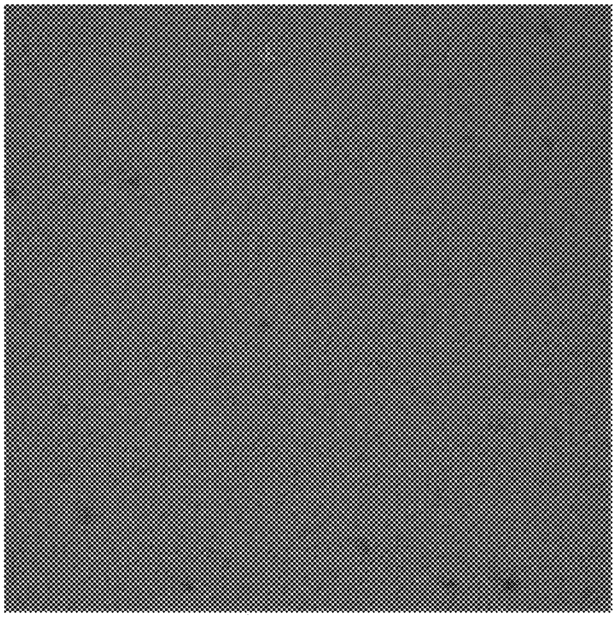
FIG. 4A shows surface oxidation of a CuMgAl alloy film according to an embodiment of the present disclosure in an air atmosphere at 150° C.
Figure 4B:
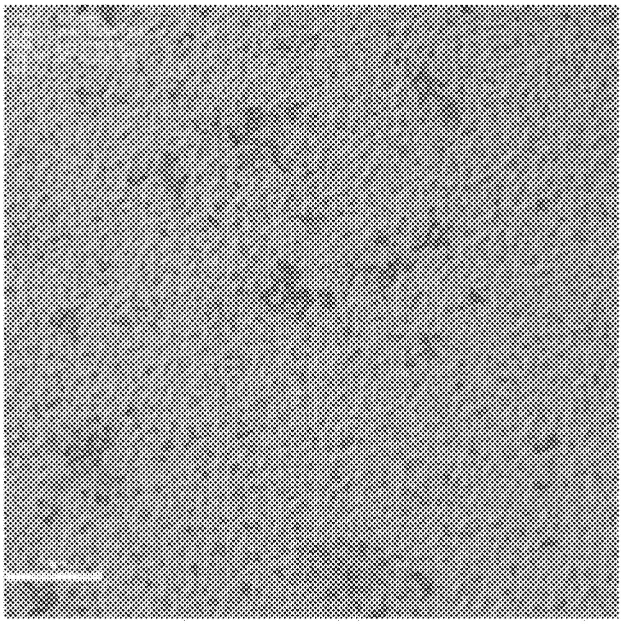
FIG. 4B shows surface oxidation of a CuMgAl alloy film according to an embodiment of the present disclosure in a $N_2$ atmosphere at 250° C.

In addition, the inventor of the present disclosure also tested the surface oxidation of the CuNi alloy thin film in the related art and the CuMgAl alloy thin film according to an embodiment of the present disclosure in an air atmosphere of 150° C. and an $N_2$ atmosphere of 250° C., respectively. As shown in FIG. 3A and FIG. 3B, FIG. 4A and FIG. 4B, FIG. 3A and FIG. 3B show the surface oxidation of the CuNi alloy film in an air atmosphere of 150° C. and a $N_2$ atmosphere of 250° C. respectively. It can be seen that the surface of the CuNi alloy film is obviously oxidized (more black spots on the surface) in the $N_2$ atmosphere of 250° C., indicating that the surface of the CuNi alloy film is oxidized in a high temperature environment. FIG. 4A and FIG. 4B show the surface oxidation of the CuMgAl alloy film according to an embodiment of the present disclosure in an air atmosphere of 150° C. and a $N_2$ atmosphere of 250° C. respectively. It can be seen that the surface of the CuMgAl alloy film according to an embodiment of the present disclosure does not change significantly in the $N_2$ atmosphere of 250° C. (fewer black spots on the surface), indicating that the surface of the CuMgAl alloy thin film according to embodiments of the present disclosure does not undergo significant oxidation in a high temperature environment.

Figure 5A:
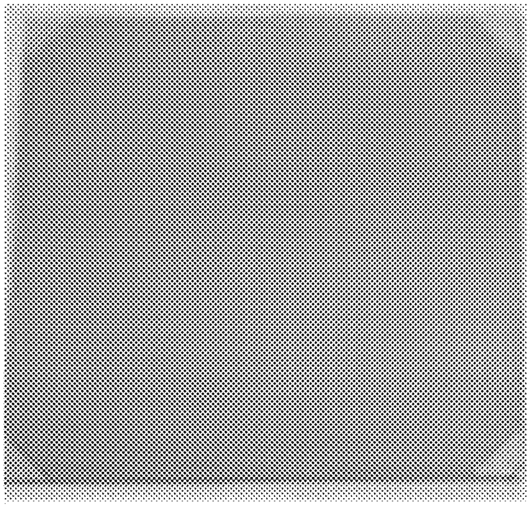
FIG. 5A shows a surface color of a film after depositing CuMgAl.
Figure 5B:
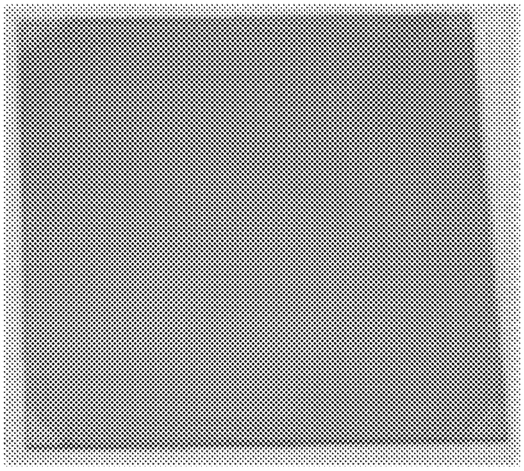
FIG. 5B shows a surface color of a CuMgAl alloy film in an air atmosphere at 150° C. for 60 minutes.
Figure 5C:
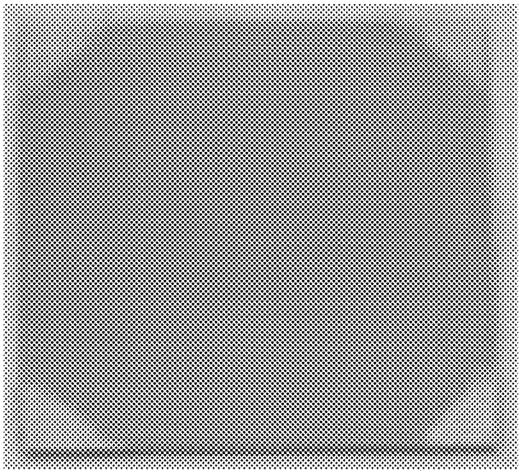
FIG. 5C shows a surface color of a CuMgAl alloy film in a nitrogen atmosphere at 250° C. for 30 minutes.

Further, as shown in FIG. 5A to FIG. 5C, FIG. 5A shows the surface color of the CuMgAl alloy film without heat treatment after depositing the CuMgAl alloy film according to an embodiment of the present disclosure. FIG. 5B shows the surface color of the CuMgAl alloy film in the air at 150° C. for 60 minutes according to an embodiment of the present disclosure. FIG. 5C shows the surface color of the CuMgAl alloy film in the $N_2$ atmosphere at 250° C. for 30 minutes. It can be seen that after the CuMgAl alloy film being in the air at 150° C. for 60 minutes and in the $N_2$ atmosphere at 250° C. for 30 minutes, the surface color of the CuMgAl does not change significantly, indicating that the surface of the CuMgAl alloy film according to an embodiment of the present disclosure does not undergo significant oxidation. Therefore, the oxidation protection layer made of CuMgAl alloy according to an embodiment of the present disclosure has better oxidation resistance in high-temperature environments.

Figure 6:
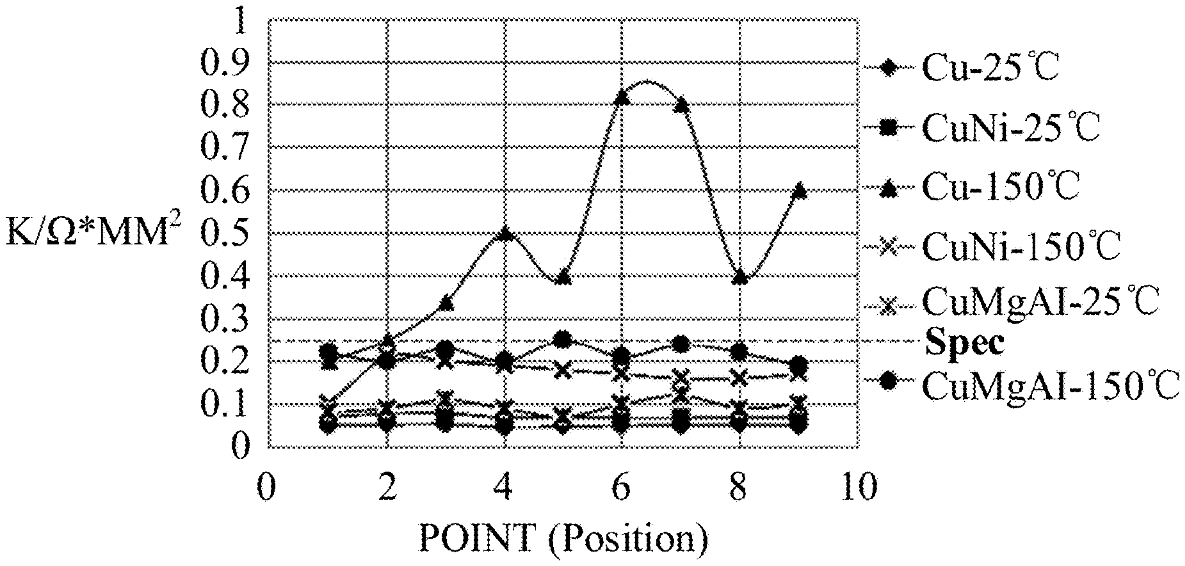
FIG. 6 shows K(R*S) value characterization data of oxidation protection layers of different materials at different temperatures.

In some embodiments, the circuit board needs to use metal wirings with low resistivity to make circuits, so the oxidation protection layer is optionally made of materials with lower resistivity. Since the oxidation protection layer is generally deposited by sputtering at the room temperature, when the oxidation protection layer is subsequently bonded to electronic components, the circuit board needs to be in a high-temperature environment (such as reflow soldering, white oil curing and other processes). Considering that an area (S) of bonding connection between the oxidation protection layer and the flexible printed circuit (FPC), or an area (S) of bonding connection between the oxidation protection layer and the electronic components may also affect the reliability test after bonding, K (R*S) is used to comprehensively consider the impact of CuMgAl resistance (R) and alignment area (S) on FPC bonding. After the high-temperature process, if the resistance (R) is too high and the alignment area (S) is also large, the K value may be too large. When the FPC inputs signals subsequently, the heat generated at the bonding position may be high, then during the reliability test, FPC or electronic components are prone to falling off. Therefore, the inventor of the present disclosure tested the resistance of the oxidation protection layer made of CuMgAl alloy in deposition status at room temperature and the resistance of the oxidation protection layer made of CuMgAl alloy after high temperature treatment, as shown in FIG. 6. FIG. 6 respectively illustrates that the K(R*S) of the first pads (represented by Cu) which does not include an oxidation protection layer in the related art at room temperature (25° C.) and 150° C., K(R*S) of the oxidation protection layer made of CuNi alloy at room temperature (25° C.) and 150° C.), and K(R*S) of the oxidation protection layer made of CuMgAl alloy at room temperature (25° C.) and 150° C., where the abscissa represents different positions (POINT) on the surface of the oxidation protection layer, and the horizontal line Spec is a standard value (i.e. K=0.25). If K(R*S) is higher than the standard value, CuMgAl does not meet the low resistance requirements. If K(R*S) is lower than the standard value, CuMgAl meets the low resistance requirements. It can be seen that the material according to an embodiment of the present disclosure is a CuMgAl alloy. The K(R*S) measured at different positions on the surface of the oxidation protection layer at room temperature (25° C.) and 150° C. is less than or equal to the standard value. Therefore, the oxidation protection layer of CuMgAl alloy according to an embodiment of the present disclosure is not only able to achieve antioxidant performance and but also have low resistance properties.

Figure 8:
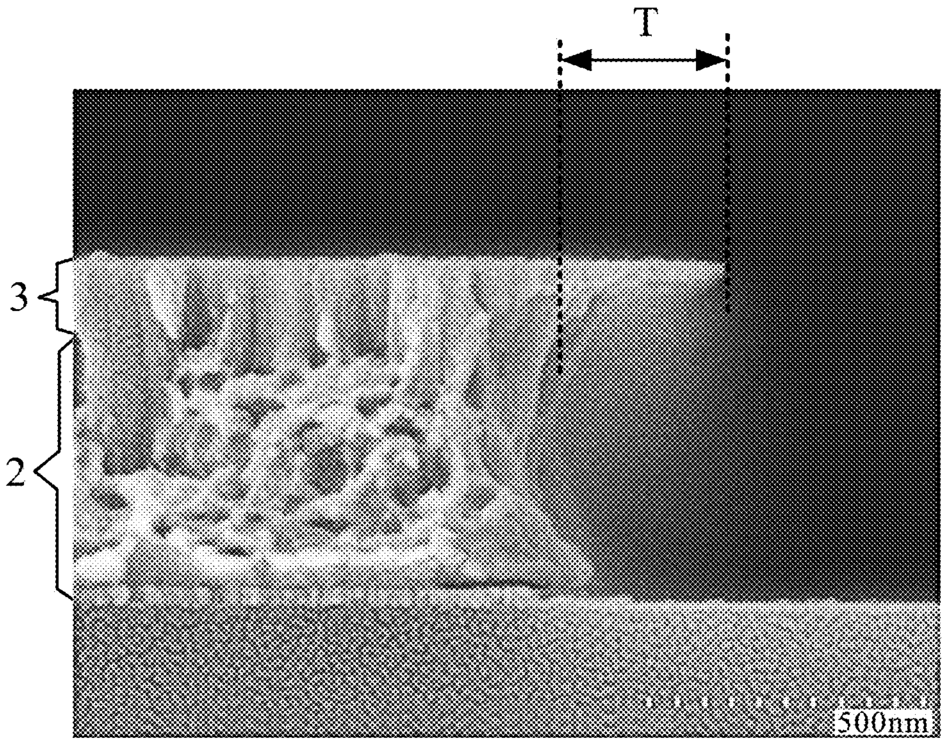
FIG. 8 is a scanning electron microscope photograph of an oxidation protection layer made of CuNi alloy in the related art after etching.

In specific implementation, in the above-mentioned circuit board according to an embodiment of the present disclosure, as shown in FIG. 1, the material of the first pads (2 and 2') includes Cu. Taking the material of the oxidation protection layer 3 as CuMgAl as an example, the pattern of the first pads (2 and 2') and the pattern of the oxidation protection layer 3 are simultaneously formed through the same etching process. FIG. 7 shows a scanning electron microscope (SEM) photograph of a laminated structure formed by the first pads and the oxidation protection layer 3, including a first metal layer 21 with a thickness of about 500 Å, and a second metal layer 22 formed of Cu with a thickness of about 600 Å. The laminated structure of the first metal layer 21 and the second metal form the first pads 2, and an oxidation protection layer 3 with a thickness of about 500 Å is formed on the first pads 2 by CuMgAl alloy. It can be seen that after etching, the oxidation protection layer 3 exceeds about 0.1 μm relative to the edge of the first pads 2, and there is basically no obvious T (roof structure, within the oval solid line frame), so the oxidation protection layer 3 has good etched morphology which will not cause poor coverage or breakage problems for other film layers subsequently formed on the oxidation protection layer. As shown in FIG. 8, FIG. 8 is an SEM photograph of the oxidation protection layer made of CuNi alloy after etching in the related art. It can be seen that after etching the oxidation protection layer made of CuNi alloy exceeds about 0.4 μm relative to the edge of the first pads, which is significantly larger than the size by which the oxidation protection layer 3 made of CuMgAl alloy of the present disclosure exceeds the edge of the first pads 2 after etching. The problems of poor coverage or breakage are prone to occur on other film layers subsequently formed on the oxidation protection layer.

In specific implementation, the above circuit board according to an embodiment of the present disclosure, as shown in FIG. 1, further includes a first wiring layer 5 located between the first pads (2 and 2') and the base substrate 1. The first wiring layer 5 includes a first sub-metal layer 51, a first sub-wiring layer 52 and a second sub-metal layer 53 which are stacked. The first pads (2 and 2') and the second pads 4 are electrically connected to different conductive patterns/conductive lines in the second sub-metal layer 53 respectively.

A material of the first sub-metal layer 51 and the second sub-metal layer 53 includes molybdenum-niobium alloy. The molybdenum-niobium alloy has adhesion and enhances the adhesion between the first wiring layer 5 and the base substrate 1. In some cases, in order to prevent the overall area of the first wiring layer 5 from being too large, causing the base substrate 1 to be subject to excessive stress and causing fragmentation, a buffer layer can be provided between the base substrate 1 and the first wiring layer 5 to relieve stress. In addition, the first sub-metal layer 51 made of molybdenum-niobium alloy can also enhance the adhesion between the first wiring layer 5 and the buffer layer. The material of the buffer layer is, for example, silicon nitride. At the same time, the second sub-metal layer 53 made of molybdenum-niobium alloy is connected to the first pads 2'. Since the molybdenum-niobium alloy has adhesion, the molybdenum-niobium alloy can ensure that the first wiring layer 5 and the first pads 2' are connected firmly. The molybdenum-niobium alloy has electrical conductivity and can ensure the electrical conductivity between the first pads 2' and the first wiring layer 5. The material of the first sub-wiring layer 52 can include copper, which has good electrical conductivity and can ensure the electrical connection between the film layers. The small resistance of copper can reduce current loss during operation. The low price of copper can reduce the production cost of the array substrate. In addition, the second sub-metal layer 53 made of molybdenum-niobium alloy can protect the copper of the first sub-wiring layer 52 and prevent the copper from being oxidized.

In specific implementation, as shown in FIG. 1 and FIG. 7, the thickness of the first metal layer 21 may be 100 Å to 800 Å. The thickness of the second metal layer 22 may be 1000 Å to 8000 Å. Optionally, the thickness of the first metal layer 21 may be 300 Å, and the thickness of the second metal layer 22 is 6000 Å.

In specific implementation, as shown in FIG. 1, the thickness of the first sub-metal layer 51 is optionally 300 Å, and the thickness of the first wiring layer 5 is 1 μm to 5 μm.

In specific implementation, as shown in FIG. 1, the second pads 4 are an example of a film layer arranged on the same layer as the first pads (2 and 2'). Of course, the second pads 4 can also be arranged on the same layer as the first wiring layer 5, or the second pads 4 simultaneously adopt film layers arranged on the same layer as the first wiring layer 5 and the first pads (2 and 2').

In specific implementation, in the above circuit board according to an embodiment of the present disclosure, as shown in FIG. 1, the device area A1 further includes: a first passivation layer 6 located between the first wiring layer 5 and the first pads (2 and 2'), a first planarization layer 7 located between the first passivation layer 6 and the first pads (2 and 2'), a second planarization layer 8 located on a side away from the base substrate 1, of the oxidation protection layer 3 and covering an area between the plurality of first pads (2 and 2'), and a first connection portion 9 located on the oxidation protection layer 3.

Figure 9:
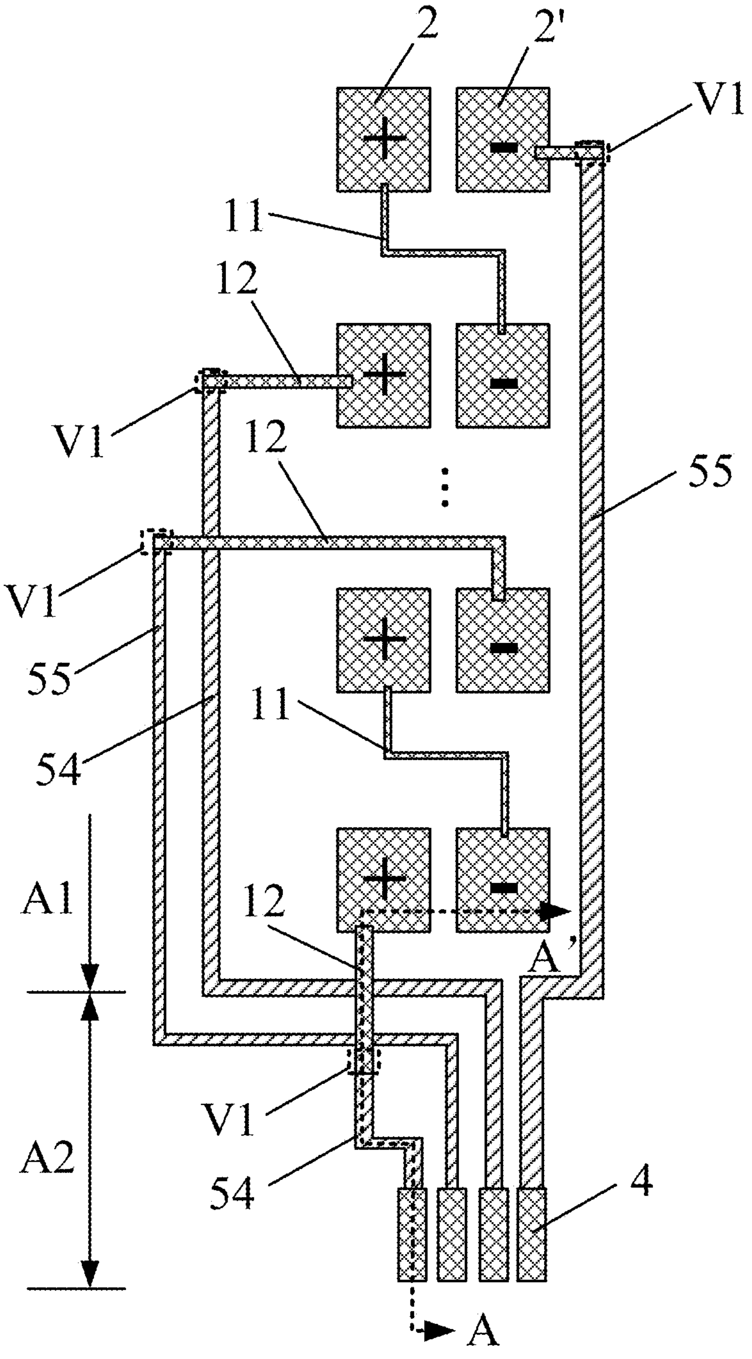
FIG. 9 is a schematic top structural view of a circuit board according to an embodiment of the present disclosure.

As shown in FIG. 9, FIG. 1 is a schematic cross-sectional view along the AA' direction in FIG. 9. The first wiring layer 5 may include an anode wiring 54 and a cathode wiring 55 (not shown in FIG. 1), that is, the anode wiring 54 and the cathode wiring 55 are both arranged by stacking the first sub-metal layer 51, the first sub-wiring layer 52 and the second sub-metal layer 53. In order to reduce the voltage drop (IR Drop), the thickness of the first sub-wiring layer 52 is greater than the thickness of the first pads (2 and 2'), and the thickness of the first sub-wiring layer 52 is positively related to the product size of the Mini-LED backboard. The sputtering process can be used to sequentially fabricate the first sub-metal layer 51, the first sub-wiring layer 52 and the second sub-metal layer 53. The second sub-metal layer 53 can protect the first sub-wiring layer 52 and prevent the surface of the first sub-wiring layer 52 from being oxidized.

In specific implementation, as shown in FIG. 1, the first passivation layer 6 includes a portion located between the anode wiring 54 and the cathode wiring 55 to separate adjacent wirings and avoid incorrect electrical connection occurrence of adjacent wirings. The material of the first passivation layer 6 may be silicon nitride, silicon oxide, silicon oxynitride, etc. The first planarization layer 7 covers the area between the anode wiring 54 and the cathode wiring 55. The first planarization layer 7 can be an organic film and is configured to fill the gap area between the wirings to avoid large steps in the subsequent process to ensure that the problem of electronic component displacement does not occur when the electronic components are bonded, improving the flatness of the array substrate. At the same time, the first planarization layer 7 can also play an insulating role.

As shown in FIG. 1, the material of the first connection portion 9 on the oxidation protection layer 3 is a welding metal material, such as tin, tin-copper alloy, tin-silver alloy, etc.

As shown in FIG. 1, the thickness of the first passivation layer 6 may be 1000 Å to 4000 Å.

In specific implementation, in the above-mentioned circuit board according to an embodiment of the present disclosure, as shown in FIG. 1, the bonding area A1 further includes: a second passivation layer 10 located between the first wiring layer 5 and the second pads 4, a third planarization layer 20 located between the second passivation layer 10 and the second pads 4, a fourth planarization layer 30 located on the side away from the base substrate 1, of the oxidation protection layer 3 and covering the area between the plurality of second pads 4, and a second connection portion 40 located on the oxidation protection layer 3.

The third planarization layer 20 and the first planarization layer 7 are arranged in a same layer and can form an integral structure, and the material thereof can be an organic material, such as resin, used for planarization to facilitate subsequent processes (such as the preparation of the first pads 2 and the second pads 4, etc.). The fourth planarization layer 30 and the second planarization layer 8 are arranged in a same layer and can form an integral structure, and the material thereof can be an organic material, such as resin, used for planarization to facilitate subsequent processes (such as preparation of the protection layer 50). The second passivation layer 10 and the first passivation layer 6 are arranged in a same layer and can form an integral structure, and the material thereof can be silicon oxynitride, silicon nitride, silicon oxide, etc.

As shown in FIG. 1, the thickness of the second passivation layer 10 may be 1,000 Å to 9,000 Å.

Figure 10:
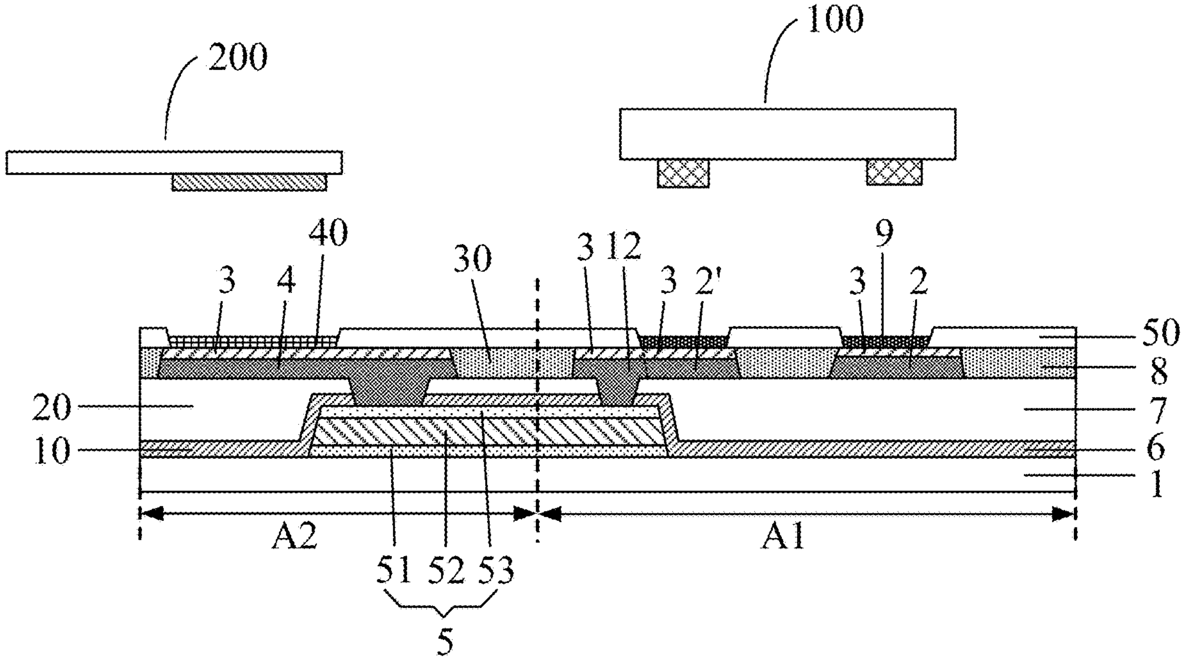
FIG. 10 is another schematic cross-sectional view along the direction AA' in FIG. 9.

During specific implementation, the above-mentioned circuit board according to an embodiment of the present disclosure may further include a plurality of electronic components. The electronic components may include micro light-emitting diodes 100 as shown in FIG. 10. It should be noted that since each of the micro light-emitting diodes 100 includes an anode pin and a cathode pin, one of the micro light-emitting diodes 100 needs to be bonded through two first pads. The plurality of first pads can be divided into a plurality of groups of first pads. Each of the groups of the first pads is configured to bond one micro light-emitting diode and includes a cathode pad and an anode pad arranged in pairs. The first pad bonded to the cathode pin of the micro light-emitting diode is called the cathode pad, and the first pad bonded to the anode pin of the micro light-emitting diode is called the anode pad. As shown in FIG. 9, each of the groups of the first pads includes a cathode pad 2' and an anode pad 2 arranged in pairs. The cathode pad 2' and the anode pad 2 include the same film layer structure.

As shown in FIG. 10, the micro light-emitting diode 100 is bonded to the cathode pad 2' and the anode pad 2 through the first connection portion 9 and the oxidation protection layer 3. Since the main component of the material of the first connection portion 9 is tin, the material of the oxidation protection layer 3 according to an embodiment of the present disclosure is $Cu_aMg_bX_c$, $Cu_aMg_bX_c$ can react with the first connection portion 9 to be bonded and complete bonding.

As shown in FIG. 10, the printed circuit 200 is bonded and connected to the second pads 4 through the second connection portion 40 and the oxidation protection layer 3. The printed circuit 200 includes a printed circuit board, a flexible circuit board, an integrated circuit chip, etc. The material of the second connection portion 40 may be thermosetting glue or anisotropic conductive glue.

In specific implementation, in the above-mentioned circuit board according to an embodiment of the present disclosure, as shown in FIG. 1 and FIG. 9, the plurality of first pads (2 and 2') are divided into a plurality of groups of first pads. Each of the groups of the first pads includes a cathode pad 2' and an anode pad 2 arranged in pairs.

The circuit board further includes a second wiring layer arranged in a same layer as the plurality of first pads (2 and 2'). A side away from the base substrate 1, of the second wiring layer includes an oxidation protection layer 3. The second wiring layer is configured to realize the series connection or parallel connection of the plurality of groups of first pads (2 and 2'), and the second wiring layer is further configured to be electrically connected to the first wiring layer 5 by a through hole penetrating the first planarization layer 7 and the first passivation layer 6.

As shown in FIG. 1 and FIG. 9, the second wiring layer includes a wiring 11 and a wiring 12. As shown in FIG. 1, the wiring 12 and the first pad 2' are an integral structure. In FIG. 1, the wiring 12 and the first pad 2' are separated by a dotted line.

The specific connection method of the above-mentioned groups of first pads is not limited. In FIG. 9, two adjacent groups of first pads are connected in series as an example for illustration. As shown in FIG. 1 and FIG. 9, a plurality of first pads (2 and 2') can be divided into a plurality of groups of first pads. Each of the groups of first pads is configured to bond one micro light-emitting diode, and includes a cathode pad 2' and an anode pad 2 arranged in pairs. The first wiring layer 5 may include an anode wiring 54 and a cathode wiring 55. The first pads of two adjacent groups are connected in series through the wiring 11. As shown in FIG. 1 and FIG. 9, in the two groups of first pads connected in series, the anode pad 2 of one group is connected to a wiring 12. The wiring 12 is electrically connected to the anode wiring 54 by a through hole V1 penetrating the first passivation layer 6 and the first planarization layer 7. The anode wiring 54 is electrically connected to the second pad 4 by a through hole (not shown in FIG. 1) penetrating the first passivation layer 6 and the first planarization layer 7. The cathode pad of the other group is connected to another wiring 12. The wiring 12 is electrically connected to the cathode wiring 55 by another through hole V1 penetrating the first passivation layer 6 and the first planarization layer 7. The cathode wiring 55 is electrically connected to another second pad 4 by a through hole (not shown in FIG. 1) penetrating the first passivation layer 6 and the first planarization layer 7. In FIG. 9, the cathode pad 2', the anode pad 2, the second pad 4, the wiring 11 and the wiring 12 are arranged in the same layer, and the same filling pattern is used to illustrate the cathode pad 2', the anode pad 2, the second pads 4, the wiring 11 and the wiring 12. The anode wiring 54 and the cathode wiring 55 are arranged in the same layer, and the same filling pattern is used to illustrate the anode wiring 54 and the cathode wiring 55.

It can be understood that the present disclosure does not limit the driving method of the circuit board. As shown in FIG. 9, the circuit board can drive the electronic components in a passive manner, or the circuit board can also provide signals to the electronic components through a drive circuit including thin film transistors, or can provide signals to the electronic components through microchips.

When signals are provided to electronic components through microchips, each of the microchips includes a plurality of pins. The circuit board further includes third pads located in the device area for bonding connection with the pins of the microchip. The structure of the third pad is similar to that of the first pad, and can be made using the same film structure as the first pad. The plurality of electronic components can be divided into a plurality of lamp areas. Each of the lamp areas includes at least one electronic component, and each of the microchips is configured to drive the electronic component of at least one lamp area to emit light.

During specific implementation, the above-mentioned circuit board according to an embodiment of the present disclosure, as shown in FIG. 1 and FIG. 10, further includes a protection layer 50 located on a side away from the base substrate 1, of the oxidation protection layer 3. The protection layer 50 exposes the oxidation protection layer 3. The material of the protection layer 50 may include silicon oxynitride, silicon nitride or silicon oxide.

In specific implementation, in the above circuit board according to an embodiment of the present disclosure, the electronic components may be mini light-emitting diodes (Mini LED), also known as sub-millimeter light emitting diodes, or micro light-emitting diodes (Micro LED).

When the circuit board according to an embodiment of the present disclosure is used as a backlight source, the electronic components can use Mini LEDs. The size and pitch of Mini LEDs are small, and not only can make local dimming zones more detailed, achieve high-dynamic range (HDR) to present a high-contrast effect, and can also shorten the optical distance (OD) to reduce the thickness of the whole machine to meet the thinning requirement.

Based on the same inventive concept, an embodiment of the present disclosure further provides a display device, including: the above-mentioned circuit board according to an embodiment of the present disclosure, a printed circuit and a plurality of electronic components. The electronic components can be Mini LEDs or Micro LEDs.

The plurality of electronic components are electrically connected to the plurality of first pads of the circuit board through the oxidation protection layer, and the printed circuit is electrically connected to the plurality of second pads of the circuit board through the oxidation protection layer.

The display device has the characteristics of high contrast, good brightness, and high color reproduction. The display device may be a rigid display device or a flexible display device (that is, bendable or foldable). The display device can be: a mobile phone, a tablet computer, a television, a monitor, a notebook computer, a digital photo frame, a navigator, or any other product or component with a display function. Other essential components of the display device are understood by those of ordinary skill in the art, and will not be described in detail here, nor should they be used to limit the present disclosure. The principle of solving the problem of the display device is similar to that of the aforementioned circuit board. Therefore, the implementation of the display device can be referred to the implementation of the aforementioned circuit board, and the repetitive parts will not be repeated here.

In the circuit board and display device according to an embodiment of the present disclosure, after the first pad is prepared using Cu material, an oxidation protection layer of $Cu_aMg_bX_c$ is prepared on the first pads, where X includes at least one of Al, Sn, Pb, Au, Ag, In, Zn, Bi, Ga, V, W, Y, Zr, Mo, Nb, Pt, Co, or Sb. On one hand, X can diffuse to a side away from the base substrate, of the oxidation protection layer, so that X is enriched on the side sway from the base substrate, of the oxidation protection layer. The X enriched on the surface-is oxidized to form a passivation layer. On the other hand, a $Cu_aMg_bX_pO_g$ transition layer can be formed between $Cu_aMg_bX_c$ and the passivation layer, thereby ensuring that the passivation layer $X_mO_n$ formed by X oxidation and the $Cu_aMg_bX_c$ alloy do not delaminate, that is, a complete transition between $Cu_aMg_bX_c$ and the oxidation protection layer is possible. The $Cu_aMg_bX_pO_g$ can further inhibit Cu in the first pad from being oxidized due to diffusing to the side away from the base substrate, of the oxidation protection layer. Therefore, the oxidation protection layer according to an embodiment of the present disclosure can prevent the first pads from being oxidized. In addition, by adding an anti-oxidation $Cu_aMg_bX_c$ alloy film layer on the first pads, the embodiment of the present disclosure can achieve oxidation resistance without additional anti-oxidation process, greatly simplifying the process flow and reducing mass production costs. Moreover, in embodiments of the present disclosure, the $Cu_aMg_bX_c$ alloy film can be deposited by target sputtering, there is no need to use anti-oxidation processes such as nickel gold or Organic Solderability Preservatives (OSP) after making the pads in the related art, which reduces costs and improves productivity efficiency. Moreover, the $Cu_aMg_bX_c$ oxidation protection layer provided by embodiments of the present disclosure has good oxidation resistance in high temperature environments.

Obviously, those skilled in the art can make various changes and modifications to the present disclosure without departing from the spirit and scope of the disclosure. In this way, if these modifications and variations of the present disclosure fall within the scope of the claims of the present disclosure and equivalent technologies, the present disclosure is also intended to include these modifications and variations.

What is claimed is:

1. A circuit board, comprising:

a base substrate comprising a device area;

a plurality of first pads located on a side of the base substrate and in the device area, wherein a material of the first pads comprises Cu;

an oxidation protection layer located on a side away from the base substrate, of the first pads, wherein the plurality of first pads are bonded to a plurality of electronic components through the oxidation protection layer; a material of the oxidation protection layer comprises $Cu_aMg_bX_c$, wherein X comprises one or any combination of Al, Sn, Pb, Au, Ag, In, Zn, Bi, Ga, V, W, Y, Zr, Mo, Nb, Pt, Co or Sb;

wherein in the material of the oxidation protection layer, a sum of a mass fraction of Mg and a mass fraction of X accounts for 5% to 90%.

2. The circuit board according to claim 1, wherein a thickness of the oxidation protection layer is in a range of 100 Å to 1000 Å.

3. The circuit board according to claim 1, wherein a mass fraction of Cu accounts for 20% to 95%, the mass fraction of Mg accounts for 5% to 80%, and the mass fraction of X accounts for 10% to 40%.

4. The circuit board according to claim 1, wherein an atomic ratio of Cu, Mg and X is 61:10:29.

5. The circuit board according to claim 1, wherein the first pad comprises: a first metal layer located between the base substrate and the oxidation protection layer, and a second metal layer between the first metal layer and the oxidation protection layer; wherein a material of the first metal layer is same as the material of the oxidation protection layer, and a material of the second metal layer comprises Cu.

6. The circuit board according to claim 1, wherein the base substrate further comprises a bonding area, the bonding area comprises a plurality of second pads located on the base substrate, the plurality of second pads are configured to be bonded to a printed circuit; the second pads and the first pads are located on a same film layer, and a side away from the base substrate, of the second pads comprises the oxidation protection layer.

7. A display device, comprising: the circuit board according to claim 1, a printed circuit and a plurality of electronic components;

the plurality of electronic components are electrically connected to the plurality of first pads of the circuit board through the oxidation protection layer, and the printed circuit is electrically connected to a plurality of second pads of the circuit board through the oxidation protection layer.

8. The circuit board according to claim 6, further comprising a first wiring layer located between the first pads and the base substrate, wherein the first wiring layer comprises a first sub-metal layer, a first sub-wiring layer and a second sub-metal layer which are stacked; wherein the first pads are electrically connected to the second sub-metal layer, and the second pads are electrically connected to the second sub-metal layer;

a material of the first sub-metal layer and a material of the second sub-metal layer comprise molybdenum-niobium alloy, and a material of the first sub-wiring layer comprises copper.

9. The display device according to claim 7, wherein each of the electronic components is a Mini LED or a Micro LED.

10. The circuit board according to claim 8, wherein the device area further comprises: a first passivation layer located between the first wiring layer and the first pads, a first planarization layer between the first passivation layer and the first pads, a second planarization layer located on a side away from the base substrate, of the oxidation protection layer and covering an area between the plurality of first pads, and a first connection portion located on the oxidation protection layer.

11. The circuit board according to claim 8, further comprising a protection layer located on a side away from the base substrate, of the oxidation protection layer, the protection layer exposes the oxidation protection layer, a material of the protection layer comprises silicon nitride or silicon oxide.

12. The circuit board according to claim 10, wherein the bonding area further comprises: a second passivation layer located between the first wiring layer and the second pads, a third planarization layer between the second passivation layer and the second pads, a fourth planarization layer located on the side away from the base substrate, of the oxidation protection layer and covering an area between the plurality of second pads, and a second connection portion located on the oxidation protection layer; wherein the third planarization layer and the first planarization layer are arranged in a same layer, the fourth planarization layer and the second planarization layer are arranged in a same layer, and the second passivation layer and the first passivation layer are arranged in a same layer.

13. The circuit board according to claim 10, wherein the plurality of first pads are divided into a plurality of groups of first pads, each of the groups of the first pads comprises a cathode pad and an anode pad arranged in pairs;

the circuit board further comprises a second wiring layer arranged in a same layer as the plurality of first pads, and a side away from the base substrate, of the second wiring layer comprises the oxidation protection layer, and the second wiring layer is configured to realize a series connection or parallel connection of the plurality of groups of the first pads, and the second wiring layer is further configured to be electrically connected to the first wiring layer by a through hole penetrating the first planarization layer and the first passivation layer.

14. A circuit board, comprising:

a base substrate comprising a device area;

a plurality of first pads located on a side of the base substrate and in the device area, wherein a material of the first pads comprises Cu;

an oxidation protection layer located on a side away from the base substrate, of the first pads, wherein the plurality of first pads are bonded to a plurality of electronic components through the oxidation protection layer; a material of the oxidation protection layer comprises $Cu_aMg_bX_c$, wherein X comprises one or any combination of Al, Sn, Pb, Au, Ag, In, Zn, Bi, Ga, V, W, Y, Zr, Mo, Nb, Pt, Co or Sb;

wherein the first pad comprises: a first metal layer located between the base substrate and the oxidation protection layer, and a second metal layer between the first metal layer and the oxidation protection layer; wherein a material of the first metal layer is same as the material of the oxidation protection layer, and a material of the second metal layer comprises Cu.

15. A circuit board, comprising:

a base substrate comprising a device area;

a plurality of first pads located on a side of the base substrate and in the device area, wherein a material of the first pads comprises Cu;

an oxidation protection layer located on a side away from the base substrate, of the first pads, wherein the plurality of first pads are bonded to a plurality of electronic components through the oxidation protection layer; a material of the oxidation protection layer comprises $Cu_aMg_bX_c$, wherein X comprises one or any combination of Al, Sn, Pb, Au, Ag, In, Zn, Bi, Ga, V, W, Y, Zr, Mo, Nb, Pt, Co or Sb;

wherein the base substrate further comprises a bonding area, the bonding area comprises a plurality of second pads located on the base substrate, the plurality of second pads are configured to be bonded to a printed circuit; the second pads and the first pads are located on a same film layer, and a side away from the base substrate, of the second pads comprises the oxidation protection layer.

16. The circuit board according to claim 15, further comprising a first wiring layer located between the first pads and the base substrate, wherein the first wiring layer comprises a first sub-metal layer, a first sub-wiring layer and a second sub-metal layer which are stacked; wherein the first pads are electrically connected to the second sub-metal layer, and the second pads are electrically connected to the second sub-metal layer;

a material of the first sub-metal layer and a material of the second sub-metal layer comprise molybdenum-niobium alloy, and a material of the first sub-wiring layer comprises copper.

17. The circuit board according to claim 16, wherein the device area further comprises: a first passivation layer located between the first wiring layer and the first pads, a first planarization layer between the first passivation layer and the first pads, a second planarization layer located on a side away from the base substrate, of the oxidation protection layer and covering an area between the plurality of first pads, and a first connection portion located on the oxidation protection layer.

18. The circuit board according to claim 16, further comprising a protection layer located on a side away from the base substrate, of the oxidation protection layer, the protection layer exposes the oxidation protection layer, a material of the protection layer comprises silicon nitride or silicon oxide.

19. The circuit board according to claim 17, wherein the bonding area further comprises: a second passivation layer located between the first wiring layer and the second pads, a third planarization layer between the second passivation layer and the second pads, a fourth planarization layer located on the side away from the base substrate, of the oxidation protection layer and covering an area between the plurality of second pads, and a second connection portion located on the oxidation protection layer; wherein the third planarization layer and the first planarization layer are arranged in a same layer, the fourth planarization layer and the second planarization layer are arranged in a same layer, and the second passivation layer and the first passivation layer are arranged in a same layer.

20. The circuit board according to claim 17, wherein the plurality of first pads are divided into a plurality of groups of first pads, each of the groups of the first pads comprises a cathode pad and an anode pad arranged in pairs;

the circuit board further comprises a second wiring layer arranged in a same layer as the plurality of first pads, and a side away from the base substrate, of the second wiring layer comprises the oxidation protection layer, and the second wiring layer is configured to realize a series connection or parallel connection of the plurality of groups of the first pads, and the second wiring layer is further configured to be electrically connected to the first wiring layer by a through hole penetrating the first planarization layer and the first passivation layer.

* * * * *